(12) United States Patent
Chien et al.

(10) Patent No.: US 8,413,505 B2
(45) Date of Patent: Apr. 9, 2013

(54) TEMPERATURE AND HUMIDITY MEASURING DEVICE DEPLOYED ON SUBSTRATE

(75) Inventors: Ke-Chih Chien, Tucheng (TW); Ming-Long Chiu, Tucheng (TW); Pao-Yi Lu, Tucheng (TW)

(73) Assignee: Gudeng Precision Industrial Co, Ltd, Taipei County (TW)

( * ) Notice: Subject to any disclaimer, the term of this patent is extended or adjusted under 35 U.S.C. 154(b) by 292 days.

(21) Appl. No.: 12/914,841

(22) Filed: Oct. 28, 2010

(65) Prior Publication Data

US 2012/0103092 A1 May 3, 2012

Related U.S. Application Data

(63) Continuation of application No. 12/912,903, filed on Oct. 27, 2010, now abandoned.

(51) Int. Cl.
*G01N 19/10* (2006.01)

(52) U.S. Cl.
USPC ............... 73/335.02; 73/335.04; 73/335.05; 73/31.06

(58) Field of Classification Search ............. 73/335.02
See application file for complete search history.

(56) References Cited

U.S. PATENT DOCUMENTS

| | | | | |
|---|---|---|---|---|
| 4,737,707 A * | 4/1988 | Mori et al. | ...... | 324/689 |
| 5,388,443 A * | 2/1995 | Manaka | ...... | 73/31.06 |
| 6,483,324 B1 * | 11/2002 | Mitter et al. | ...... | 324/689 |
| 6,840,103 B2 * | 1/2005 | Lee et al. | ...... | 73/335.05 |
| 7,013,700 B2 * | 3/2006 | Rombach | ...... | 73/1.06 |
| 7,181,966 B2 * | 2/2007 | Isogai et al. | ...... | 73/335.04 |
| 7,552,635 B2 * | 6/2009 | Chang et al. | ...... | 73/335.05 |
| 7,553,071 B2 * | 6/2009 | Legl et al. | ...... | 374/28 |
| 2009/0244501 A1 * | 10/2009 | Anderson et al. | ...... | 355/30 |

\* cited by examiner

*Primary Examiner* — Hezron E Williams
*Assistant Examiner* — Mark A Shabman
(74) *Attorney, Agent, or Firm* — Ming Chow; Sinorica, LLC

(57) ABSTRACT

The present invention provides a temperature and humidity measuring and recording device deployed on substrate for measuring and recording temperature and humidity of the interior of any station for reticles and of any SMIF POD. The temperature and humidity measuring and recording device comprises a substrate with a first surface and a second surface opposite to the first surface on another side of the substrate, a first measurement unit embedded in and fixed to the first surface of the substrate for measuring the temperature and humidity of the surrounding environment, and a second measurement unit embedded in and fixed to the second surface of the substrate for measuring the temperature and humidity of the interior between the substrate and the pellicle film.

4 Claims, 4 Drawing Sheets

TEMPERATURE AND HUMIDITY MEASURING DEVICE DEPLOYED ON SUBSTRATE

This application is a continuation-in-part of, and claims a priority to U.S. Ser. No. 12/912,903 filed on Oct. 27, 2010.

BACKGROUND OF THE INVENTION

1. Field of the Invention

The present invention is related to a temperature and humidity measuring device, and more particularly, to a device deployed on a substrate that is equipped with the function of temperature and humidity measuring and recording.

2. Description of the Prior Art

In the rapidly developing modern semiconductor technology in which feature size continues to shrink, optical lithography technology plays an important role. The pattern definition relies fully on optical lithography technology. In the application of optical lithography technology related to semiconductors, pre-designed circuit paths are fabricated as light-transparent reticle in specific form. Basing on the principle of exposure, after light from the light source passes through the reticle and is projected on the photoresist layer of a silicon wafer, specific circuit pattern can be exposed on the silicon wafer. However, due to continuous minimization of the feature size in process technology, the environmental requirements for the exposure process to be maintained will become stricter and stricter. Better environmental control is thus needed for the integration operation and exposure operation before the exposure. For example, difference between the degree of temperature or humidity of the pellicle film and that of the substrate will lead to changes in the precision of position of mark on the substrate and on the pellicle film and in the precision of position of the exposed pattern, which will then cause loss of focus and failure to form pattern of high precision. The issue of how to monitor and record humidity and temperature in SMIF POD as semiconductor process of a few tens of nm has been developed is thus very important.

Considering what is described above, the present invention hereby provides a temperature and humidity measuring device deployed on substrate, and more particularly, a temperature and humidity measuring device deployed on a reticle for monitoring the environmental conditions of the interior of the exposure equipment.

SUMMARY OF THE INVENTION

According to the above, one primary objective of the present invention is to provide a temperature and humidity measuring and recording device deployed on substrate, wherein the temperature and humidity measurer and sensor in the substrate is used to monitor the internal environment of the exposure equipment and to transfer the monitor data of the sensor back to the control unit for recording to increase the precision and efficiency of monitoring.

Another primary objective of the present invention is to provide a temperature and humidity measuring device deployed on substrate, wherein the temperature and humidity measuring device is placed in the library of the exposure equipment to continuously monitor the environmental conditions of the library.

Still another primary objective of the present invention is to provide a temperature and humidity measuring device deployed on substrate, wherein the temperature and humidity measuring device is deployed in SMIF POD to continuously monitor the environmental conditions of the SMIF POD.

According to the aforementioned objectives, the present invention first provides a temperature and humidity measuring device deployed on substrate, which comprises at least a substrate, a first measurement unit, a second measurement unit, a first signal transfer unit, and a second signal transfer unit. The substrate can be a mask. The first measurement unit and the second measurement are RH sensors for measuring the temperature and humidity of the surroundings of the substrate. The first signal transfer unit and the second signal transfer unit are plug-in connector-type transfer device for recording the temperature and humidity of the surroundings and transferring the records back to a control unit; wherein the first measurement unit is located at the outer end of the substrate for measuring the temperature of the outer surroundings of the substrate, and the second measurement unit is located inside the pellicle film for measuring the temperature of the interior between the substrate and the pellicle film.

The present invention further provides a temperature and humidity measuring device deployed on substrate, which comprises at least a substrate, a first measurement unit, a second measurement unit, a first signal transfer unit, and a second signal transfer unit. The substrate can be a mask. The first measurement unit and the second measurement are RH sensors for measuring the temperature and humidity of the surroundings and recording the measured results in the measuring device. The first signal transfer unit and the second signal transfer unit are connector-type transfer device for transferring the records of the temperature and humidity of the environment back to a central control terminal. Wherein the first measurement unit is located at the outer end of the substrate for measuring the temperature of the outer surroundings of the substrate, and the second measurement unit is embedded from a through hole of the outer end and fixed in the through hole for measuring the temperature of the interior between the substrate and the pellicle film. Since the second measurement unit is embedded from and fixed in the through hole of the outer end, the dismounting can be operated from the outer end without damaging the pellicle film on the other end.

With the design provided by the present invention, changes in the precision of position of mark on the substrate and on the pellicle film and in the precision of position of the exposed pattern resulting from differences in conditions of temperature or humidity in the exposure process can be further prevented. By monitoring the exposure environment, the precision of the operation of the exposure process can thus be further improved.

DESCRIPTION OF THE PREFERRED EMBODIMENTS

The present invention mainly discloses a temperature and humidity measuring device deployed on substrate, in which the fabrication of some components utilized such as reticle and sensor are achieved by using current art and is thus not completely described in detail in the following description. And the drawings referred to in the following description are not made according to actual sizes but only for illustrating characteristics related to the present invention.

Figure 1:
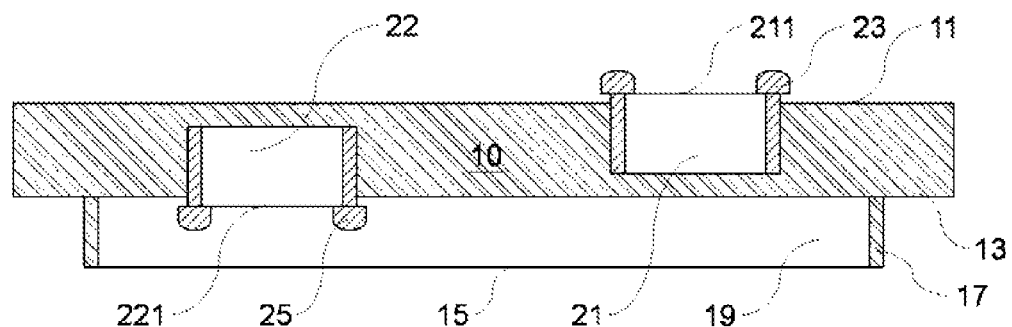
FIG. 1 is a side view of the present invention.

First, referring to FIG. 1, which is a sectional view of the present invention. As shown in FIG. 1, the temperature and humidity measuring device comprises a substrate 10 with a first surface 11 and a second surface 13, the size of which is the same as reticle used in the exposure equipment; a frame 17 of certain thickness and formed on the second surface 13 of the substrate 10; a pellicle layer 15 further formed on the frame 17 that encloses the second surface 13 in the frame 17 for an enclosed space 19 to form between the pellicle layer 15 and the second surface 13 in the frame 17; a first measurement unit 21 with a sensing side 211 and a back side, the back side of the first measurement unit 21 being embedded in and fixed to the first surface 11 of the substrate 10 and the first measurement unit 21 being lock-fastened to the first surface 11 via a plurality of first lock-fasteners 23 to expose the sensing side 211 of the first measurement unit 21 for measuring the environment; and a second measurement unit 22 with a sensing side 221 and a back side, the back side of the second measurement unit 22 being embedded in and fixed to the second surface 13 of the substrate 10 and the second measurement unit 22 being lock-fastened to the second surface 13 of the substrate 10 via a plurality of second lock-fasteners 25 to expose the sensing side 221 of the second measurement unit 22. The second measurement unit 22 is deployed in an enclosed space 19 formed between the pellicle layer 15 and the frame 17, and therefore the second measurement unit 22 is used to measure the conditions such as temperature and humidity of the environment in the enclosed space 19.

Figure 2A:
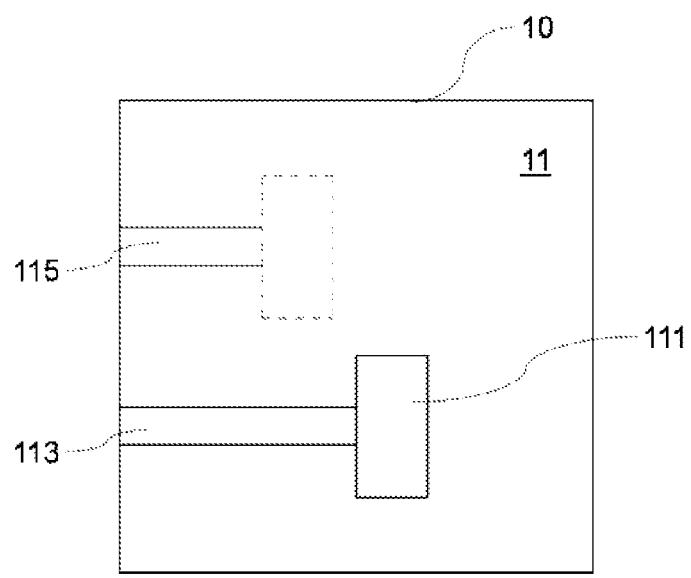
FIG. 2A is a top view of the first surface of substrate of the first embodiment of the present invention.
Figure 2B:
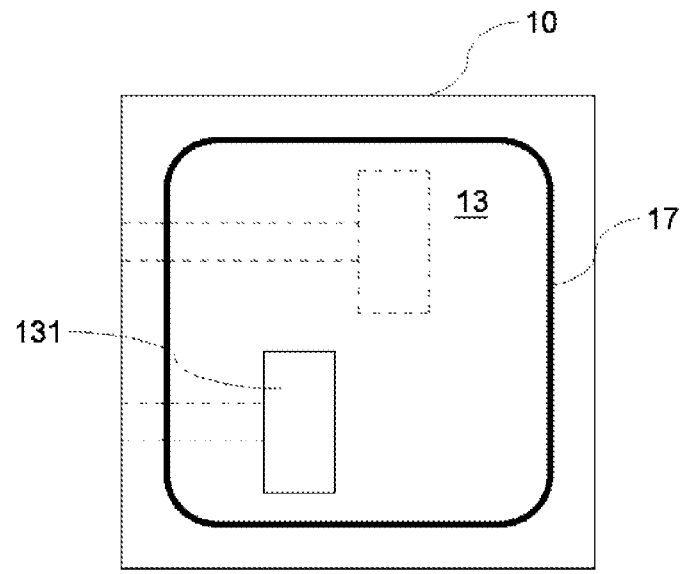
FIG. 2B is a top view of the second surface of substrate of the first embodiment of the present invention.

Then, referring to FIG. 2A and FIG. 2B, which are top views of substrate of a first embodiment of the present invention. As shown in FIG. 2A, a rectangular groove 111, a long channel 113, and a short channel 115 are formed on a first surface 11 of the substrate 10, wherein the rectangular groove 111 and the long channel 113 are interconnected and the depth of the rectangular groove 111 is larger than the depth of the long channel 113. Refer then to FIG. 2B. A rectangular groove 131 is formed on a second surface 13 of the substrate 10. The rectangular groove 131 is located within the frame 17 and its location does not overlap with the location of the rectangular groove 111 on the first surface 11. Meantime, the short channel 115 on the first surface 11 and the rectangular groove 131 on the second surface 13 are interconnected.

Figure 3:
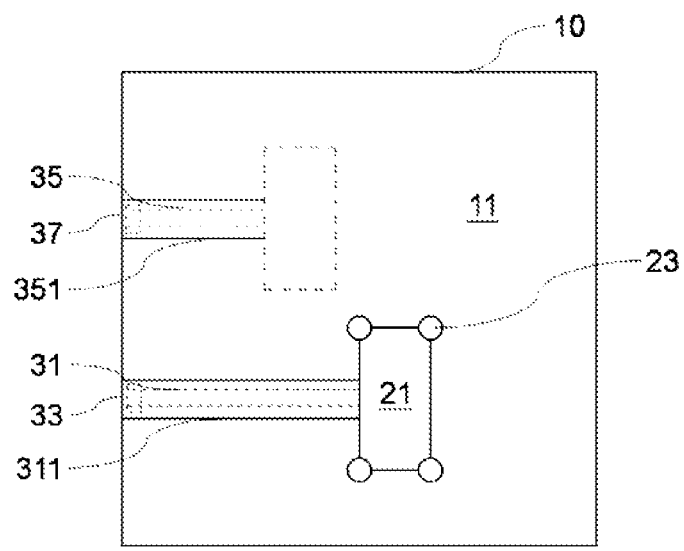
FIG. 3 is a top view of the deployment of measurement unit of the first surface of the first embodiment of the present invention.

Refer then to FIG. 3, which is a top view of the measurement unit deployed on the first surface of the substrate of the present invention. As shown in FIG. 3, the back side of the first measurement unit 21 is embedded in the rectangular groove 111 of the substrate 10 and is then fixed by a first lock-fastener 23 to expose the sensing side 211 of the first measurement unit 21 for measuring the environment; wherein the first measurement unit 21 is a RH sensor. A first signal transfer unit 31 is then deployed within the long channel 113 with its first end electrically connected to one side of the first measurement unit 21 and its second end fixed to the side of the substrate 10 to form a port 33. The first signal transfer unit 31 transfers the data of temperature and humidity of the environment measured by the first measurement unit 21 to a control device (not shown in Figure) via the port 33; electric power needed for the operation of the measuring device of the present invention is supplied by battery set inside the measuring device. In addition, a first cover plate 311 is fixedly lodged on the long channel 113, with which the first signal transfer unit 31 is covered and fastened; in the present invention the long channel 113 is filled with epoxy putty but the material used to form the first cover plate 311 is not limited. And then a second transfer unit 35 is deployed in the short channel 115 with its first end being floating and waiting to be electrically connected with the second measurement unit 22 and its second end fixed to a side of the substrate 10 to form a port 37. Similarly, a second cover plate 351 can be used to be fixedly lodged on the short channel 115 and to cover and fasten the second signal transfer unit 35. The ports 33 and 37 of the first signal transfer unit 31 and of the second signal transfer unit 35 could be on a same side among four sides or on different sides of the substrate 10, and both ports can be plug-in connectors.

Figure 4:
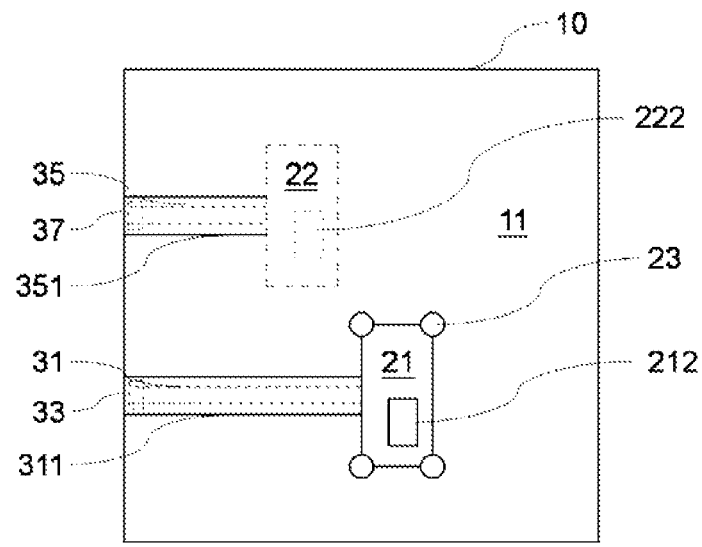
FIG. 4 is a top view of the record unit deployed on the measurement unit of the first surface of the first embodiment of the present invention.

Moreover, the present invention further provides a data storage method for the measuring device with the function of measuring and recording the temperature and humidity, referring to FIG. 4. In the measuring device in FIG. 4, a first record unit 212 is further deployed on the first measurement unit 21. During the operation of semiconductor process, the sensed data of temperature and humidity of the operation environment measured by the measurement unit will first be stored in the first record unit 212 and transferred to a control device such as PC (not shown in Figure) by external unit through the first signal transfer unit 31 via the port 33 after the operation ends. Similarly, a second record unit 222 can also be further deployed on the second measurement unit 22 for the sensed data of temperature and humidity of the operation environment to be first stored in the second record unit 222. After the operation ends, the second record unit 222 and the first record unit 212 then transfer the sensed data of temperature and humidity to a control device through the first and the second signal transfer units 31 and 35 via ports 33 and 37. The aforementioned first record unit 212 and second record unit 222 can be a kind of memory card.

Figure 5:
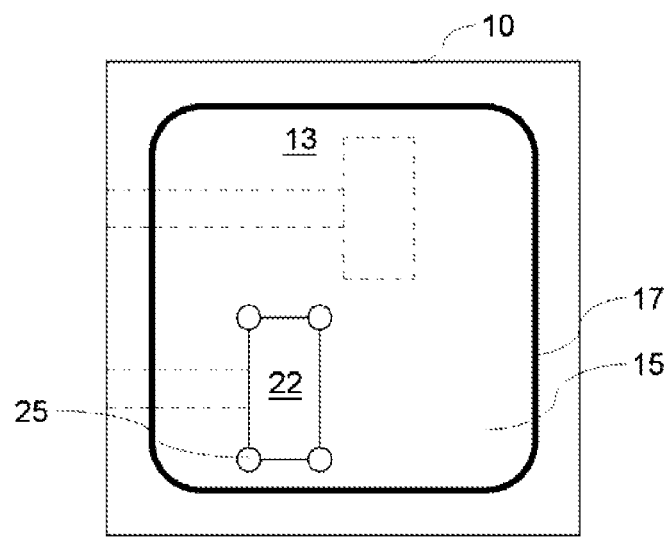
FIG. 5 is a top view of the deployment of measurement unit of the second surface of the first embodiment of the present invention.

Then, referring to FIG. 5, which is a top view of measurement unit deployed on the second surface of substrate of the present invention. The back side of the second measurement unit 22 is embedded in the rectangular groove 131 on the second surface 13 of the substrate 10 and is then fixed by a second lock-fastener 25 to expose the sensing side 221 of the second measurement unit 22; wherein the second measurement unit 22 is a RH sensor. The floating end of the second signal transfer unit 35 is then electrically connected to one side of the second measurement unit 22. The second measurement unit 22 is deployed within the frame 17, and therefore when the pellicle layer 15 is formed on the frame 17, the pellicle layer 15 encloses the second surface 13 in the frame 17 and an enclosed space 19 is thus formed. Therefore, the sensing side 221 of the second measurement unit 22 can be used to measure the conditions such as temperature and humidity in the enclosed space 19 and the measured data can be transferred to a control device via port 37.

When the first measurement unit 21 and the second measurement unit 22 of the present invention are both deployed on the first surface 11 and the second surface 13 of the substrate 10, and the first signal transfer unit 31 and the second signal transfer unit 35 are also electrically connected to the first measurement unit 21 and the second measurement unit 22, a structure as manifested in FIG. 1 can be formed. When the temperature and humidity measuring device of the present invention is placed in a POD or in the library of the exposure equipment, the first measurement unit 21 on the first surface 11 can detect and measure the temperature and humidity of the external environment surrounding the substrate 10; and the second measurement unit 22 in the enclosed space 19 on the second surface 13 can detect and measure the temperature and humidity of the internal environment of the enclosed space 19. For example, when the reticles needed for the process are all stored in the library of the exposure equipment, at this moment, the temperature and humidity measuring device of the present invention is also placed in the library for detecting and measuring the temperature and humidity of the environment in the library and the measured data can be transferred to a control device. By detecting and measuring the conditions in the enclosed space 19, the environmental conditions such as temperature and humidity in the enclosed space of each reticle in the library can be known. Apparently, staffs are able to know about the environmental conditions such as temperature and humidity in the library instantaneously and flaws due to problems of temperature or humidity of the environment can thus be prevented from occurring in the process.

Figure 6:
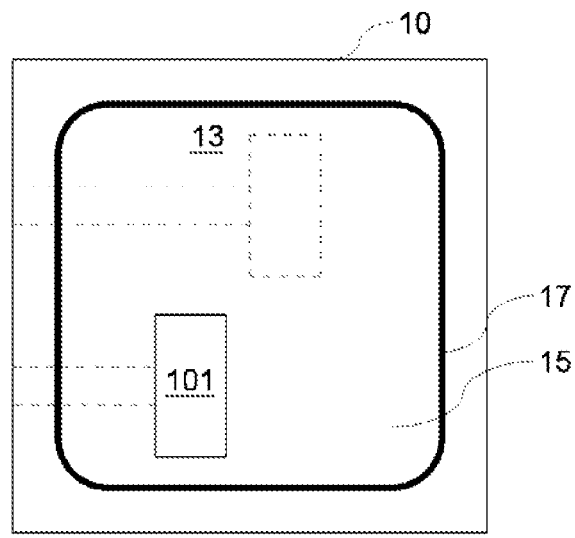
FIG. 6 is a top view of the second surface of another embodiment of the present invention.
Figure 7:
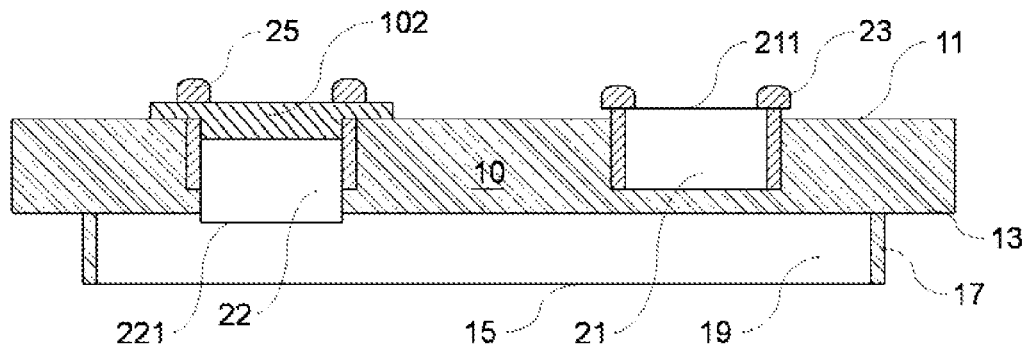
FIG. 7 is a side view of the deployment of measurement unit of another embodiment of the present invention.

Referring then to FIG. 6, which is a top view of the substrate of another embodiment of temperature and humidity measuring device of the present invention. As shown in FIG. 6, the deployment on the first surface 11 of the substrate 10 of the present embodiment is the same as that in the previous embodiment, and therefore the assembly process and the detecting and measuring function are not repeated; wherein the major difference lies in that a through hole 101 is formed in the rectangular groove 131 on the second surface 13. Therefore, the second measurement unit 22 of the present embodiment is embedded in this through hole 101 for the sensing side 221 of the second measurement unit 22 to be exposed on the second surface 13 and also for the second measurement unit 22 to be lock-fastened to the first surface 11 of the substrate 10 by the second lock-fastener 25, as shown in FIG. 7. Apparently, the purpose of forming a through hole 101 that penetrates the first surface 11 and the second surface 13 is to form an enclosed space 19 when the pellicle layer 15 is attached on the frame 17. Thus in the present embodiment, with the deployment of the through hole 101, there is no need to damage the pellicle layer 15 before dismounting the second measurement unit 22, which can be dismounted and replaced directly from the first surface 11, and the production cost can be further saved. Moreover, an enclosing plate 102 is further deployed on the through hole 101 of the first surface 11 and is lock-fastened on the first surface 11 by the second lock-fastener 25. The second measurement unit 22 is attached to the enclosing plate, and the two attached components are together embedded in and fixed to the substrate 10. The function of the enclosing plate 102 is to isolate the second measurement unit 22 from the external environment to ensure that the precision of the measurement of temperature and humidity in the enclosed space 19 of the sensing side 221 of the second measurement unit is not affected by the external environment.

While the invention has been described by way of examples and in terms of the preferred embodiments, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A temperature and humidity measuring device deployed on substrate, comprising:
   a substrate, having a first surface and a second surface opposite to said first surface on another side of said substrate, a through hole penetrating said first surface and said second surface being further deployed on said substrate;
   a first measurement unit, embedded in and fixed to said first surface of said substrate, a sensing side of which being exposed on said first surface;
   a first signal transfer unit, embedded in and fixed to said first surface of said substrate, one end of which being electrically connected to said first measurement unit and the other end of which forming a port on one side of said substrate;
   an enclosing plate, covering and being fixed on said through hole of said first surface of said substrate;
   a second measurement unit, having a sensing side, said second measurement unit being attached on said enclosing plate and being embedded in and fixed to said substrate through said through hole for said sensing side of said second measurement unit being exposed on said second surface of said substrate;
   a second signal transfer unit, embedded in and fixed to said first surface of said substrate, one end of which being electrically connected to said second measurement unit and the other end of which forming a port on one side of said substrate;
   a frame, with a height and being deployed on said second surface of said substrate, said second measurement unit being located in said frame;
   a pellicle layer, being formed on said frame for enclosing said second surface in said frame, an enclosed space being formed between said pellicle layer and said second surface in said frame.

2. The measuring device according to claim 1, wherein both said first measurement unit and said second measurement unit are RH sensors.

3. The measuring device according to claim 2, a first record unit and a second record unit are further deployed on said first measurement unit and said second measurement unit.

4. The measuring device according to claim 1, wherein said first measurement unit and said second measurement unit are fixed to said first surface of said substrate with a plurality of lock-fasteners.

* * * * *